United States Patent
Chen et al.

(10) Patent No.: US 11,871,536 B2
(45) Date of Patent: Jan. 9, 2024

(54) ECCENTRIC HEAT DISSIPATION FOR FIN COLD PLATE

(71) Applicant: Quanta Computer Inc., Taoyuan (TW)

(72) Inventors: Chao-Jung Chen, Taoyuan (TW);
Yu-Nien Huang, Taoyuan (TW);
Cheng-Yu Wen, Taoyuan (TW);
Hung-Yuan Chen, Taoyuan (TW)

(73) Assignee: QUANTA COMPUTER INC., Taoyuan (TW)

(*) Notice: Subject to any disclaimer, the term of this patent is extended or adjusted under 35 U.S.C. 154(b) by 10 days.

(21) Appl. No.: 17/660,631

(22) Filed: Apr. 25, 2022

(65) Prior Publication Data
US 2023/0262926 A1 Aug. 17, 2023

Related U.S. Application Data

(60) Provisional application No. 63/268,043, filed on Feb. 15, 2022.

(51) Int. Cl.
*H05K 7/20* (2006.01)
*H01L 23/473* (2006.01)
*F28F 3/12* (2006.01)

(52) U.S. Cl.
CPC ....... *H05K 7/20254* (2013.01); *H01L 23/473* (2013.01); *H05K 7/20772* (2013.01); *F28F 3/12* (2013.01)

(58) Field of Classification Search
CPC .......... H05K 7/20254; H05K 7/20763–20772; H05K 7/20872; H05K 7/20927; H01L 23/473; H01L 23/367–3675; F28F 3/02–06; F28F 3/12
See application file for complete search history.

(56) References Cited

U.S. PATENT DOCUMENTS

| | | | |
|---|---|---|---|
| 8,339,785 B2 * | 12/2012 | Chang | H05K 7/20927 165/80.4 |
| 9,562,728 B2 * | 2/2017 | Gotou | H05K 7/20927 |
| 10,874,030 B2 | 12/2020 | Chen et al. | |
| 2002/0011327 A1 * | 1/2002 | Fukazu | H05K 7/20927 257/E23.098 |
| 2004/0123614 A1 * | 7/2004 | Stewart | G06F 1/20 |
| 2015/0189791 A1 * | 7/2015 | Tamura | B23P 15/26 29/890.035 |

FOREIGN PATENT DOCUMENTS

| | | |
|---|---|---|
| TW | 202025892 A | 7/2020 |
| TW | M620938 U | 12/2021 |

OTHER PUBLICATIONS

TW Office Action for Application No. 111129156, dated Apr. 28, 2023, w/ First Office Action Summary.
TW Search Report for Application No. 111129156, dated Apr. 28, 2023, w/ First Office Action.

* cited by examiner

*Primary Examiner* — Zachary Pape
(74) *Attorney, Agent, or Firm* — NIXON PEABODY LLP

(57) ABSTRACT

A cooling system for a heat-generating electronic device includes a cold plate module, a flow channel, and a fin arrangement. The cold plate module includes a base plate and a top cover. The flow channel is for a liquid coolant and extends between an inlet connector and an outlet connector. The liquid coolant flows along a flow direction. The fin arrangement is located between the base plate and the top cover. The fin arrangement is thermally coupled to the flow channel and is eccentrically located relative to the cold plate module.

20 Claims, 7 Drawing Sheets

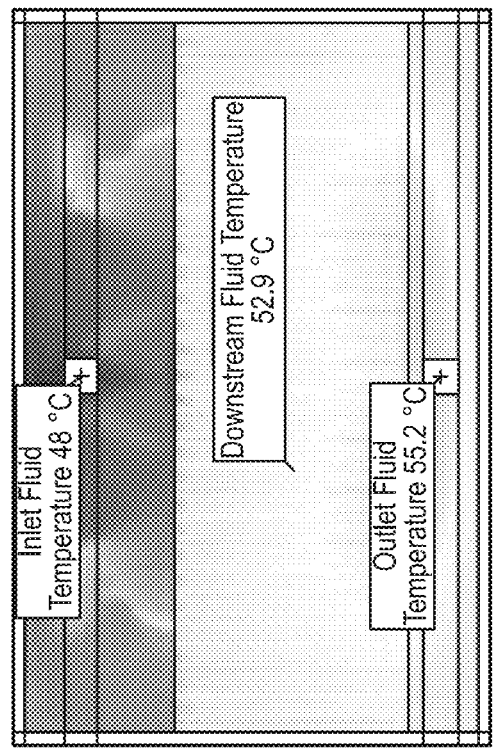
FIG. 5B
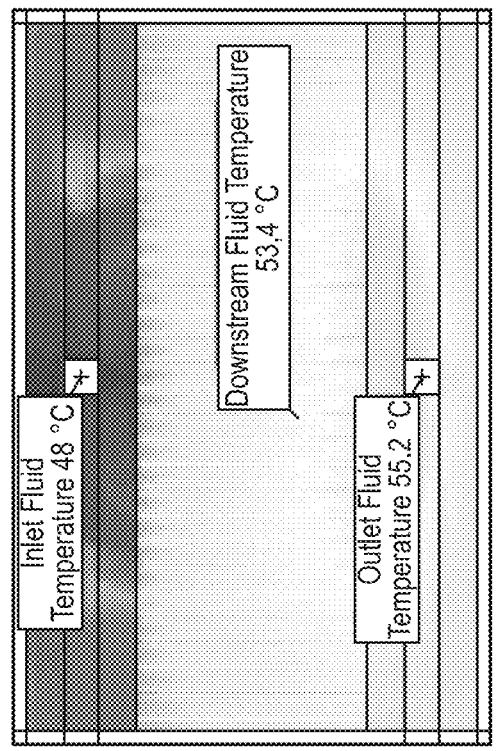
FIG. 5A
(PRIOR ART)

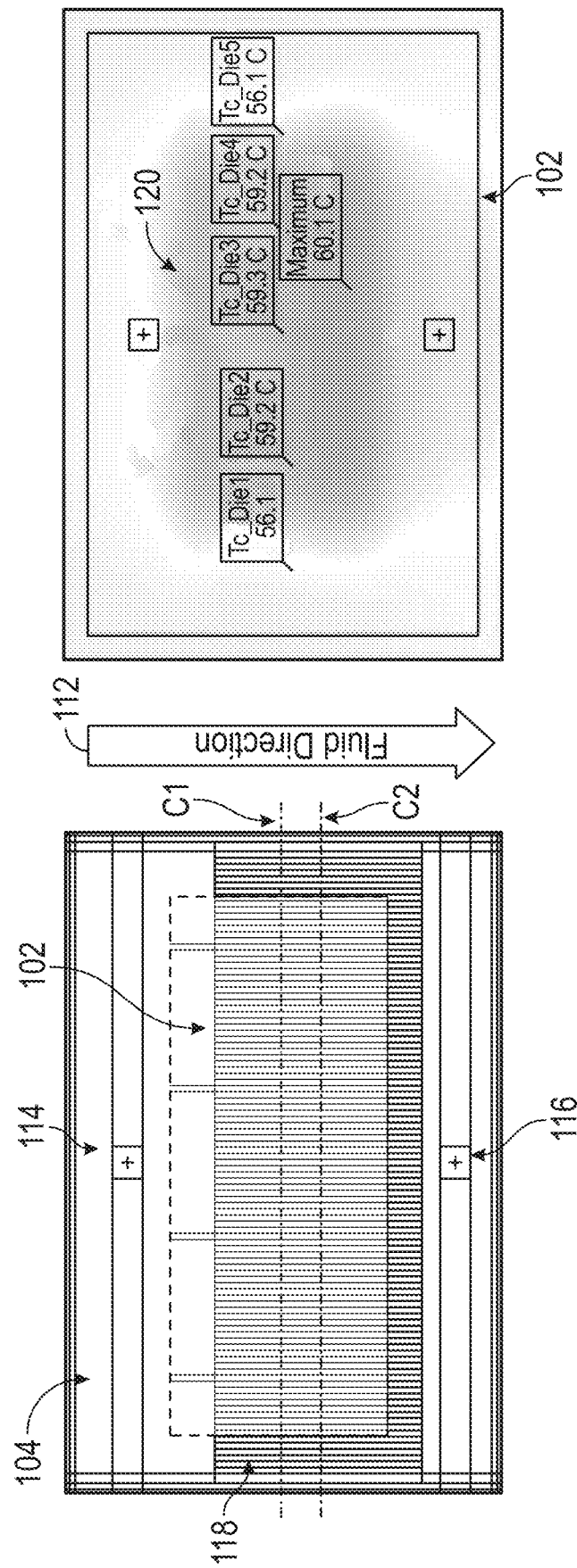

|  | Chipset Heat Source(W) | Inlet Fluid Temperature(°C) | Hottest Spot Temperature(°C) | Thermal Resistance(°C/W) |
|---|---|---|---|---|
| General Design | 500 | 48.0 | 61.0 | 0.0260 |
| Eccentric Design | 500 | 48.0 | 60.1 | 0.0242 |
| Difference (%) | - | - | - | 6.9% |

FIG. 7

ECCENTRIC HEAT DISSIPATION FOR FIN COLD PLATE

RELATED APPLICATIONS

This application claims priority to and the benefit of U.S. Provisional Application No. 63/268,043, filed on Feb. 15, 2022, which is incorporated herein by reference in its entirety.

FIELD OF THE INVENTION

The present invention relates generally to liquid cooling of a heat-generating electronic device, and more specifically, to a fin arrangement on a cold plate module for the heat-generating electronic device.

BACKGROUND OF THE INVENTION

Many computer systems, and especially server systems, include heat-generating electronic devices, such as chipsets, that require cooling for proper and efficient working condition. Typically, present cooling configurations are in the form of cold plates that use liquid cooling and fins to dissipate heat produced by the chipsets. However, present cooling configurations fail to take in account temperature distribution of the produced heat. For example, present cooling configurations are designed to place the fins in a centric (i.e., the middle or center) of the overall cooling structure. The fin placement is based on some present principles associating the centric positioning with required structural integrity. Consequently, present fin placement in a centric location results in heat accumulating at a downstream location of the cold plates, which leads to a local high temperature distribution that detrimentally affects the cooling of the heat-generating electronic devices.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, a cooling system for a heat-generating electronic device includes a cold plate module, a flow channel, and a fin arrangement. The cold plate module includes a base plate and a top cover. The flow channel is for a liquid coolant that flows along a flow direction, and extends between an inlet connector and an outlet connector. The fin arrangement is located between the base plate and the top cover. The fin arrangement is thermally coupled to the flow channel and is eccentrically located relative to the cold plate module.

According to another aspect of the cooling system described above, the fin arrangement is eccentrically located relative to at least one of the base plate and the top cover.

According to another aspect of the cooling system described above, at least one of the base plate and the top cover has a rectangular shape. The rectangular shape is defined by a length and a width, the length being longer than the width. According to one example, the fin arrangement is eccentrically located along the width of the rectangular shape.

According to another aspect of the cooling system described above, the fin arrangement is eccentrically located along the flow direction of the liquid coolant. According to one example, the fin arrangement is closer to the outlet connector than to the inlet connector.

According to another aspect of the cooling system described above, the cold plate module extends along a first axis and a second axis. The fin arrangement is eccentrically located only along one of the first axis and the second axis.

According to another aspect of the cooling system described above, the cold plate module extends along a first axis and a second axis. The fin arrangement is eccentrically located along the first axis. The fin arrangement is centrically located along the second axis.

According to another aspect of the cooling system described above, the fin arrangement extends along a first axis and a second axis. The fin arrangement extends more along the first axis than along the second axis. According to one example, the fin arrangement has a rectangular shape with a length extending along the first axis and a width extending along the second axis.

According to another aspect of the cooling system described above, the flow channel extends in a perpendicular direction relative to a length of the cold plate module. The flow channel is an interspace containing the liquid coolant between the top cover and the base plate. The interspace is thermally coupled with the fin arrangement.

According to another aspect of the cooling system described above, the fin arrangement reduces a thermal resistance by at least about 7% relative to a centrically positioned configuration.

According to another aspect of the cooling system described above, the fin arrangement is attached to the base plate. The fin arrangement is in direct contact with both the base plate and the top cover. The flow channel inside the cold plate module.

According to other aspects of the present disclosure, a computer system includes a heat-generating electronic device and a cooling configuration, which is coupled to the heat-generating electronic device. The cooling configuration includes a cold plate module, a flow channel, and a fin arrangement. The cold plate module has a first exterior surface, a first internal surface, a second exterior surface, and a second internal surface. The flow channel is inside the cold plate module. The fin arrangement is located at least in part between the first and second internal surfaces of the cold plate module. The fin arrangement is thermally coupled to the flow channel and is located off-center relative to a central point of the cold plate module.

According to another aspect of the computer system described above, the heat-generating electronic device is in the form of one or more chipsets, at least one of the one or more chipsets being attached to the second exterior surface of the cold plate module.

According to another aspect of the computer system described above, the central point of the cold plate module is along a first axis or a second axis of the cold plate module.

The first axis is perpendicular to and in the same two-dimensional plane as the second axis.

According to another aspect of the computer system described above, the flow channel is configured to extend between an inlet and an outlet. The fin arrangement is closer to the outlet than to the inlet.

According to other aspects of the present disclosure, a method is directed to cooling a heat-generating electronic device of a computer system. The method includes providing a fin arrangement coupled to a cold plate module. The fin arrangement is located at least partially within the cold plate module. The fin arrangement is eccentrically located along at least one central axis of the cold plate module. The method further includes flowing a liquid coolant within a flow channel that extends between an inlet and an outlet. The flow channel is thermally coupled with the fin arrangement inside the cold plate module. The method also includes dissipating, via the fin arrangement, heat produced by the heat-generating electronic device. The heat has a thermal footprint that is eccentric along the at least one central axis of the cold plate module.

According to another aspect of the method described above, the method further includes positioning a center point of the fin arrangement to overlap a central area of the thermal footprint. The positioning is along the at least one central axis of the cold plate module.

According to another aspect of the method described above, the method further includes flowing the liquid coolant along a narrow portion of the fin arrangement.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

FIG. 5A shows a liquid coolant temperature distribution in a centric fin placement, according to prior fin placements.

FIG. 5B shows a liquid coolant temperature distribution in an eccentric fin placement, according to other aspects of the present disclosure.

FIG. 6A is a top view illustration of a computer system having a chipset and a cooling configuration, according to other aspects of the present disclosure.

FIG. 6B shows a temperature distribution of a heat-generating electronic device illustrated in FIG. 6A.

FIG. 7 shows a table with a comparison between centric and eccentric design configurations.

DETAILED DESCRIPTION

Figure 1:
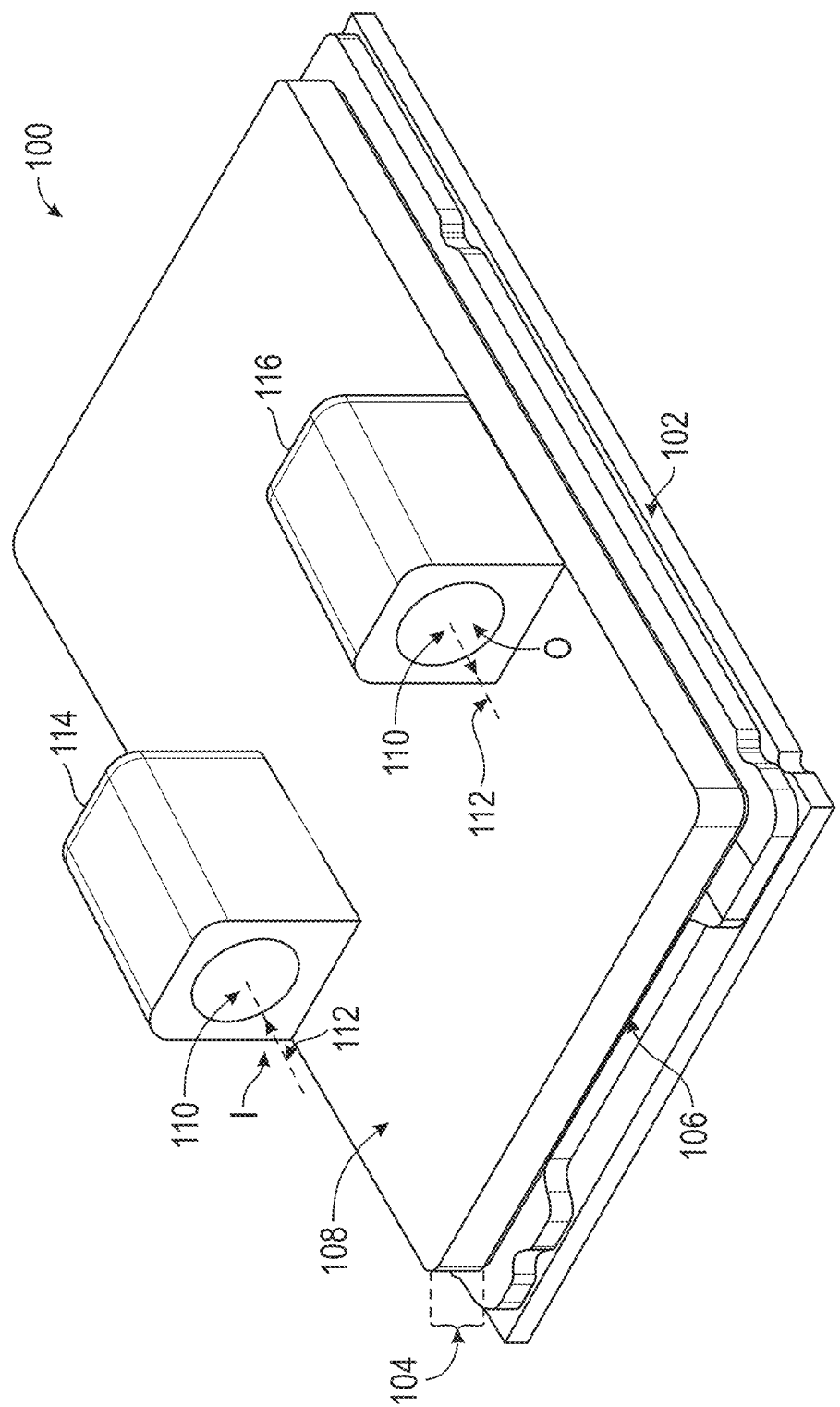
FIG. 1 is an isometric view showing a cooling system for a chipset, according to certain aspects of the present disclosure.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

Generally, an embodiment of the present invention is directed to placement of heat dissipation fins in an eccentric position of a cold plate. As such, the fins are positioned in a non-symmetrical position relative to an inlet/outlet fluid coolant arrangement of the cold plate, with the coolant arrangement being symmetrical to a center line of a heat source. The fins are positioned closer to a downstream position of the fluid coolant to result in a cooler working fluid temperature.

Figure 2:
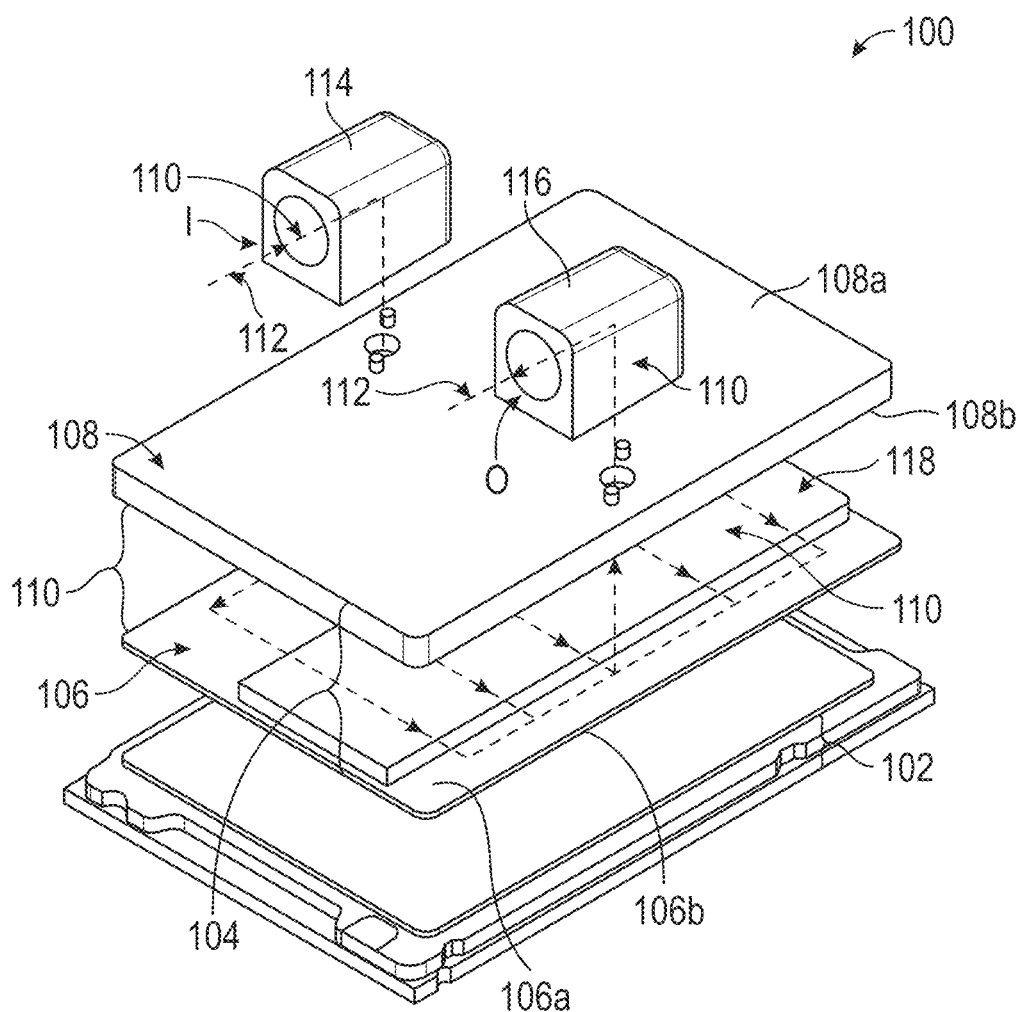
FIG. 2 is an exploded view of the cooling system shown in FIG. 1.

Referring generally to FIGS. 1 and 2, a cooling system 100 is directed to maintaining a heat generating device, such as a chipset 102, within an acceptable working temperature range. The cooling system 100 includes a cold plate module 104 that has a base plate 106 and a top cover 108. Within the top cover 108, the cooling system 100 includes a flow channel 110 for a liquid coolant 112, which helps reduce temperatures produced by the chipset 102. The flow channel 110 extends between an inlet connector 114 and an outlet connector 116. The inlet connector 114 is coupled to a coolant source, for receiving the liquid coolant 112 at an inlet point I, and the outlet connector 116 provides an exit point at an outlet point O for the liquid coolant 112 in the cold plate module 104.

Referring specifically to FIG. 2, the cooling system 100 further includes a fin arrangement 118 that is located between the base plate 106 and the top cover 108. The fin arrangement 118 is thermally coupled to the flow channel 110, and is eccentrically located relative to the cold plate module 104.

The eccentric location of the fin arrangement 118 is further described below. In general, locating the fin arrangement 118 eccentrically includes locations that are off-center (i.e., not in the center) or non-symmetrical relative to the cold plate module 104.

According to one example, the fin arrangement 118 is attached to the base plate 106. According to another example, the fin arrangement 118 is in direct contact with both the base plate 106 and the top cover 108. According to yet another example, the flow channel 110 is an interspace within the top cover 108, a base plate 106, and the fin arrangement 118.

The top surface 108a of the top cover 108 is a first exterior surface of the cold plate module 104. The top cover 108 further has a bottom surface 108b that is a first internal surface of the cold plate module 104. The base plate 106 has a top surface 106a that is a second internal surface of the cold plate module 104. The base plate 106 further has a bottom surface 106b that is a second exterior surface of the cold plate module 104. The fin arrangement 118 is generally sandwiched between the first internal surface 108b and the second internal surface 106a of the cold plate module 104. The chipset 102 is attached to the second exterior surface 106b of the cold plate module 104.

Figure 3A:
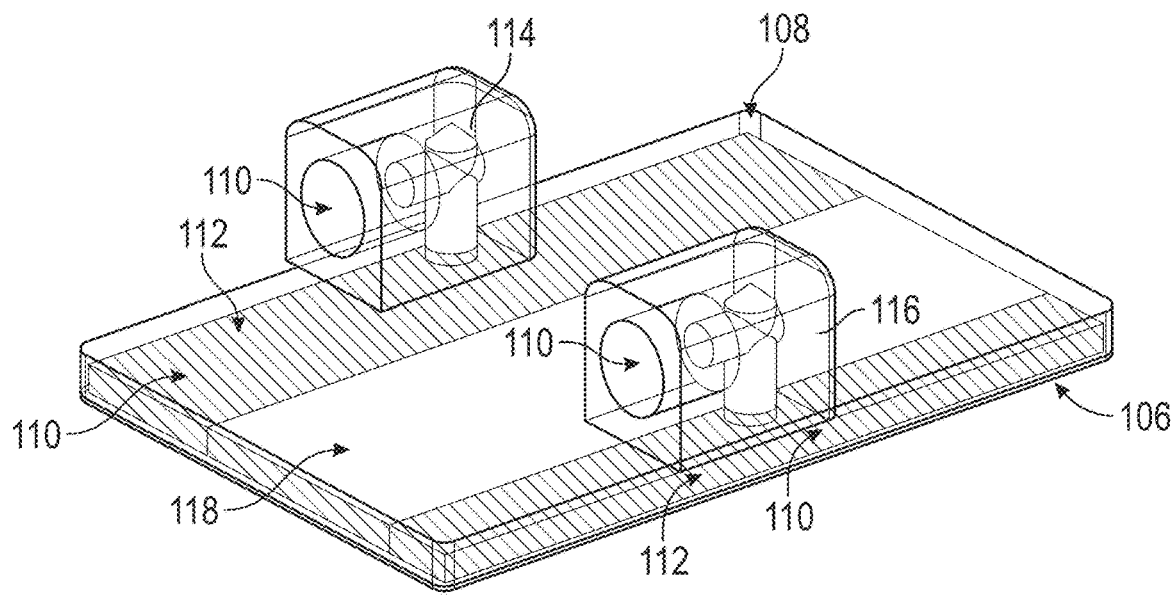
FIG. 3A is an isometric view representation illustrating internal aspects of the cooling system of FIG. 1.
Figure 3B:
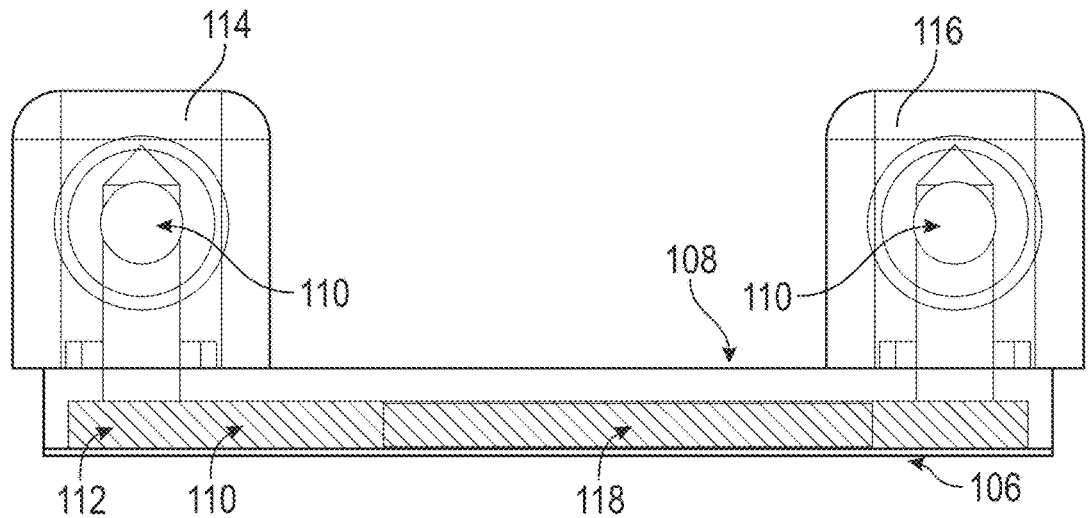
FIG. 3B is a front view representation of FIG. 3A.
Figure 3C:
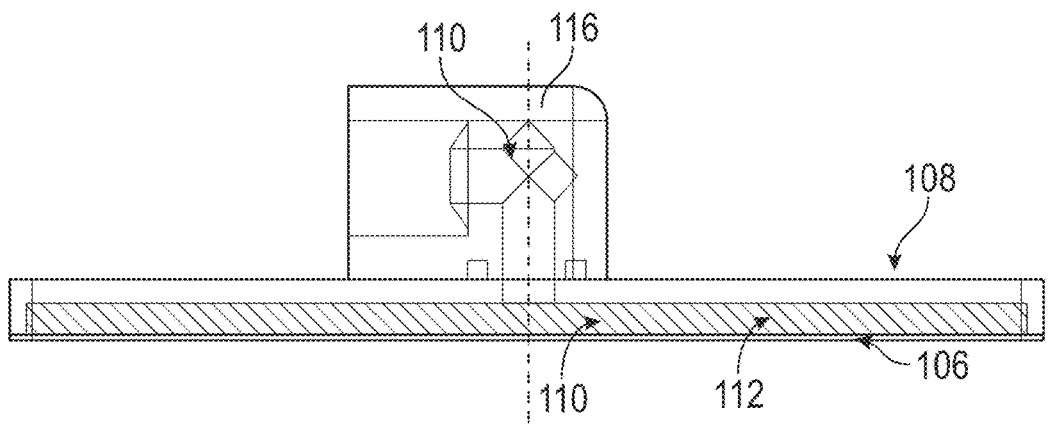
FIG. 3C is a side view representation of FIG. 3A.

Referring to FIGS. 3A-3C, the internal configuration of the flow channel 110 is illustrated and described in more detail. The flow channel 110 generally starts at the inlet connector 114, travels between the base plate 106 and the top cover 108, and generally ends at the outlet connector 116 (represented in FIGS. 3A and 3B). The flow channel 110 contains the liquid coolant 112, which also travels through gaps in the fin arrangement 118 (represented in FIGS. 3A and 3B).

Thus, the flow channel 110 is generally the interspace between the base plate 106 and the top cover 108. The flow channel 110 is further thermally coupled with the fin arrangement 118.

Figures 4A, 4B:
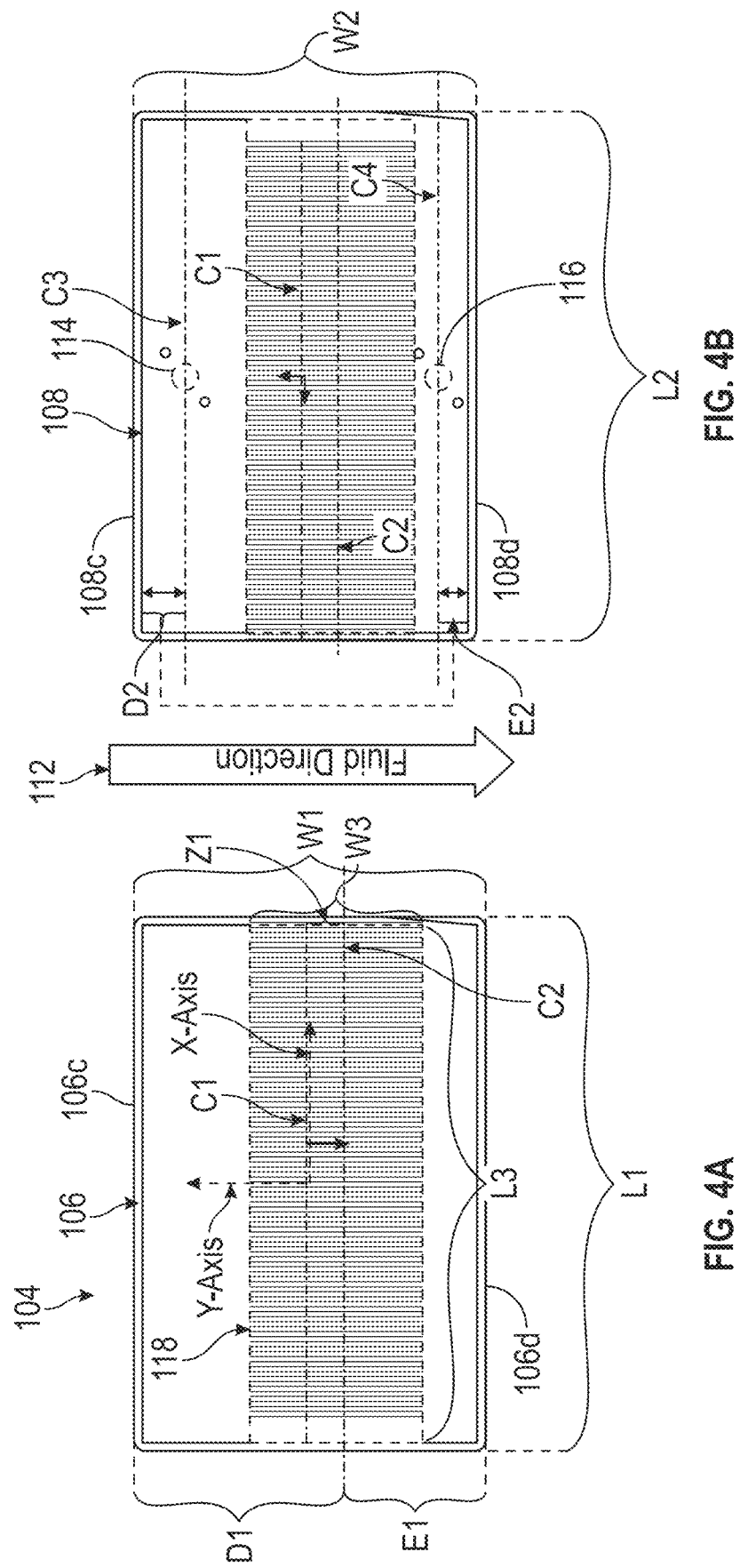
FIG. 4A is a top view illustration of an eccentric fin arrangement, according to other aspects of the present disclosure.
FIG. 4B illustrates eccentric locations of inlet and outlet connectors included in the eccentric fin arrangement of FIG. 4A.

Referring generally to FIG. 4A, the eccentric configuration of the fin arrangement 118 is illustrated in more detail. The cold plate module 104 has a rectangular shape that is defined by a length L1 and a width W1. More specifically, the base plate 106 is defined by the length L1 and the width W1, with the top cover 108 having, same dimension defined by a length L2 and a width W2. As such, the cold plate module 104 extends along a first X-axis with the length L1 and along a second Y-axis with the width W1. The fin arrangement 118, according to this example, also has a rectangular shape that is defined by a respective length L3 and width W3.

The fin arrangement 118 is smaller than both the base plate 106 and the top cover 108 along at least one of its length L3 and width W3. For example, the length L3 of the fin arrangement 118 is smaller than both the length L1 of the base plate 106 and the length L2 of the top cover 18, and the width W3 of the fin arrangement 118 is smaller than both the width W1 of the base plate 106 and the width W2 of the top cover 108.

As illustrated, the fin arrangement 118 extends along both the X-axis and the Y-axis, but extends more along the X-axis than the Y-axis. The length L3 of the fin arrangement 118 extends along the X-axis, and the width W3 of the fin arrangement 118 extends along the Y-axis.

According to other embodiments, the shape of at least one of the base plate 106, the top cover 108, and the fin arrangement 118 is different than the illustrated rectangular shape. For example, the shape is square, circular, oval, or any other geometric shape. According to other embodiments, the fin arrangement 118 is smaller than at least one of the base plate 106 and the top cover 108 along at least one of its length L3 and width W3.

The cold plate module 104, including the base plate 106 and the top cover 108, has a center line C1 that is perpendicular to the width W1 of the base plate 106 and the width W2 of the top cover 108. More specifically, the center line C1 is perpendicular to the fluid direction of the liquid coolant 112.

The fin arrangement 118 also has a center line C2 that is parallel to, but offset, from the center line C1 of the cold plate module 104. In the illustrated example, the center line C2 of the fin arrangement 118 is offset from the center line C1 of the cold plate module 104 by a distance Z1. The center line C2 of the fin arrangement 118 is also located at a distance D1 from a first edge 106c of the base plate 106, and at a distance E1 from a second edge 106d of the base plate 106. According to the illustrated example, the distance D1 is larger than the distance E1. However, in other embodiments, the distance D1 is smaller than the distance E1.

Thus, the fin arrangement 118 is eccentrically located only along one of the X-axis and the Y-axis. In the illustrated example, the fin arrangement 118 is eccentrically located along the Y-axis and is centrically located along the X-axis. In other embodiments, the fin arrangement 118 is eccentrically located along both the X-axis and the Y-axis.

Referring to FIG. 4B, the eccentric location of the inlet connector 114 and the outlet connector 116 is illustrated in more detail. The inlet connector 114 is located along a center line C3 and the outlet connector 116 is located along a center line C4. The inlet connector 114 is located at a distance D2 from a first edge 108c of the top cover 108, and at a distance E2 from a second edge 108d of the top cover 108. The distances D2 and E2 define an eccentric position for the inlet connector 114 and the outlet connector 116 relative to the center line C1 of the cold plate module 104. As such, the center point between the inlet connector 114 and the outlet connector 116, along the direction of the liquid coolant 112, is the center line C2 of the fin arrangement 118.

Referring to FIGS. 5A and 5B, liquid coolant temperature distributions show improved, beneficial results of the eccentrical configuration described above. Although both configurations—the centrical configuration illustrated in FIG. 5A and the eccentrical configuration illustrated in FIG. 5B—have identical inlet fluid temperatures of 48° C. and outlet fluid temperatures of 55.2° C., the downstream fluid temperature of 52.9° C. in the eccentrical configuration (FIG. 5B) is lower than the downstream fluid temperature of 53.4° C. in the centrical configuration (FIG. 5A). The increased cooling of about 0.5° C. (53.4° C.-52.9° C.) of the eccentrical configuration is extremely beneficial in maintaining any chipsets working below a required temperature threshold. The downstream fluid temperature is cooler in the eccentrical configuration because the fin arrangement's eccentric location more accurately matches the thermal footprint produced by a cooled chipset.

Referring generally to FIGS. 6A and 6B, the footprint (or hot spot) produced by a heat-producing electronic component is illustrated in reference to an eccentric location of a cooling system. Referring specifically to FIG. 6A, the chipset 102 is positioned in a centric location relative to the cold plate module 104, but in an eccentric location relative to the fin arrangement 118. The inlet connector 114 and the outlet connector 116 are also in an eccentric location relative to the chipset 102 and the cold plate module 104. The center line C2 of the fin arrangement 118 (which is also the center line between the inlet connector 114 and the outlet connector 116 in the flow direction of the liquid coolant 112) is offset from the center line C1 of the cold plate module 104 (which is also the center line of the chipset 102).

Referring now specifically to FIG. 6B, the temperature distribution shows an improved temperature distribution around a thermal footprint 120 produced by the chipset 102 (shown in FIG. 6A). The temperature distribution, near the Y-axis is at about 59.3° C., with two temperatures measured at 59.2° C. and a slightly higher temperature, hottest spot, of 60.1° C. Away from the Y-axis, other temperatures are much lower at 56.1° C. outside a central area of the thermal footprint 120.

Referring to FIG. 7, a table shows that the improvement of the eccentric configuration (compared with a centric configuration) is a thermal resistance (measured as a ratio of temperature vs. heat) of about 7%° C./Watts (W), e.g., 6.9%° C./W. The thermal resistance is an example for a chipset heat source that produces about 500 W, with an inlet temperature of 48.0° C., a hottest spot temperature of 61.0° C. for a centric configuration, and a hottest spot temperature of 60.1° C. for an eccentric configuration.

The thermal resistance of the presently disclosed eccentrical configuration shows an effective improvement to the uniformity of overall temperature distribution in cooling a chipset. The temperature hot spot is reduced, e.g., by at least 0.9° C. in the example above (61.0° C.-60.1° C.), and the cold plate performance (as measured by the thermal resistance) is greatly improved.

The overall improvement in the cooling configuration is achieved in response to placement of the fin arrangement closer to a downstream location of the cold plate module. The overall improvement is further achieved in response to placement of the inlet and outlet connectors closer to the downstream location of the cold plate module. Although the examples herein relate to cooling a chipset, any heat-generating electronic device requiring a cold plate may incorporate the principles herein. For example, other heat-generating electronic devices may include any integrated circuit, memory modules, VR chipsets, central processing unit (CPU) modules, field programmable gate array (FGPA) modules, and graphics processing unit (GPU) modules.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A cooling system for a heat-generating electronic device, the cooling system comprising:
    a cold plate module including a base plate and a top cover;
    a flow channel for a liquid coolant flowing along a flow direction, the flow channel extending between an inlet connector and an outlet connector; and
    a fin arrangement located between the base plate and the top cover, the fin arrangement being thermally coupled to the flow channel and being the only fin arrangement located between the base plate and the top cover, the fin arrangement being eccentrically located relative to the cold plate module.

2. The cooling system of claim 1, wherein the fin arrangement is eccentrically located relative to at least one of the base plate and the top cover.

3. The cooling system of claim 1, wherein at least one of the base plate and the top cover has a rectangular shape, the rectangular shape being defined by a length and a width, the length being longer than the width.

4. The cooling system of claim 3, wherein the fin arrangement is eccentrically located along the width of the rectangular shape.

5. The cooling system of claim 1, wherein the fin arrangement is eccentrically located along the flow direction.

6. The cooling system of claim 5, wherein the fin arrangement is closer to the outlet connector than to the inlet connector.

7. The cooling system of claim 1, wherein the fin arrangement extends along a first axis and a second axis, the fin arrangement extending more along the first axis than along the second axis.

8. The cooling system of claim 7, wherein the fin arrangement has a rectangular shape with a length extending along the first axis and a width extending along the second axis.

9. The cooling system of claim 1, wherein the flow channel extends in a perpendicular direction relative to a length of the cold plate module, the flow channel being an interspace containing the liquid coolant, the interspace being between the top cover and the base plate, the interspace being thermally coupled with the fin arrangement.

10. The cooling system of claim 1, wherein the fin arrangement is attached to the base plate, the fin arrangement being in direct contact with both the base plate and the top cover, the flow channel being inside the cold plate module.

11. A computer system comprising:
    a heat-generating electronic device; and
    a cooling configuration coupled to the heat-generating electronic device and including
        a cold plate module having a first exterior surface, a first internal surface, a second exterior surface, and a second internal surface,
        a flow channel inside the cold plate module, and a fin arrangement located at least in part between the first and second internal surfaces of the cold plate module, the fin arrangement being thermally coupled to the flow channel and located off-center relative to a central point of the cold plate module, the fin arrangement being the only fin arrangement located at least in part between the first and second internal surface of the cold plate module.

12. The computer system of claim 11, wherein the heat-generating electronic device is in the form of one or more chipsets, at least one of the one or more chipsets being attached to the second exterior surface of the cold plate module.

13. The computer system of claim 11, wherein the central point of the cold plate module is along a first axis or a second axis of the cold plate module, the first axis being perpendicular to and in the same two-dimensional plane as the second axis.

14. The computer system of claim 11, wherein the flow channel is configured to extend between an inlet and an outlet, the fin arrangement being closer to the outlet than to the inlet.

15. A method for cooling a heat-generating electronic device of a computer system, the method comprising:
providing a fin arrangement coupled to a cold plate module, the fin arrangement being located at least partially within the cold plate module, the fin arrangement being the only fin arrangement located at least partially within the cold plate module, the fin arrangement being eccentrically located along at least one central axis of the cold plate module;
flowing a liquid coolant within a flow channel that extends between an inlet and an outlet, the flow channel being thermally coupled with the fin arrangement inside the cold plate module; and
dissipating, via the fin arrangement, heat produced by the heat-generating electronic device, the heat having a thermal footprint that is eccentric along the at least one central axis of the cold plate module.

16. The method of claim 15, further comprising flowing the liquid coolant along a narrow portion of the fin arrangement.

17. A cooling system for a heat-generating electronic device, the cooling system comprising:
a cold plate module including a base plate and a top cover;
a flow channel for a liquid coolant flowing along a flow direction, the flow channel extending between an inlet connector and an outlet connector; and
a fin arrangement located between the base plate and the top cover, the fin arrangement being thermally coupled to the flow channel, the fin arrangement being eccentrically located relative to the cold plate module;
wherein the cold plate module extends along a first axis and a second axis, the fin arrangement being eccentrically located only along one of the first axis and the second axis.

18. A cooling system for a heat-generating electronic device, the cooling system comprising:
a cold plate module including a base plate and a top cover;
a flow channel for a liquid coolant flowing along a flow direction, the flow channel extending between an inlet connector and an outlet connector; and
a fin arrangement located between the base plate and the top cover, the fin arrangement being thermally coupled to the flow channel, the fin arrangement being eccentrically located relative to the cold plate module;
wherein the cold plate module extends along a first axis and a second axis, the fin arrangement being eccentrically located along the first axis, the fin arrangement being centrically located along the second axis.

19. A cooling system for a heat-generating electronic device, the cooling system comprising:
a cold plate module including a base plate and a top cover;
a flow channel for a liquid coolant flowing along a flow direction, the flow channel extending between an inlet connector and an outlet connector; and
a fin arrangement located between the base plate and the top cover, the fin arrangement being thermally coupled to the flow channel, the fin arrangement being eccentrically located relative to the cold plate module;
wherein the fin arrangement reduces a thermal resistance by at least about 7% relative to a centrically positioned configuration.

20. A method for cooling a heat-generating electronic device of a computer system, the method comprising:
providing a fin arrangement coupled to a cold plate module, the fin arrangement being located at least partially within the cold plate module, the fin arrangement being eccentrically located along at least one central axis of the cold plate module;
flowing a liquid coolant within a flow channel that extends between an inlet and an outlet, the flow channel being thermally coupled with the fin arrangement inside the cold plate module;
dissipating, via the fin arrangement, heat produced by the heat-generating electronic device, the heat having a thermal footprint that is eccentric along the at least one central axis of the cold plate module; and
positioning a center point of the fin arrangement to overlap a central area of the thermal footprint along the at least one central axis of the cold plate module.

* * * * *